United States Patent
Cheng et al.

(10) Patent No.: US 10,411,128 B1
(45) Date of Patent: Sep. 10, 2019

(54) STRAINED FIN CHANNEL DEVICES

(71) Applicant: International Business Machines Corporation, Armonk, NY (US)

(72) Inventors: Kangguo Cheng, Schenectady, NY (US); Junli Wang, Albany, NY (US); Lawrence A. Clevenger, Saratoga Springs, NY (US); Carl Radens, LaGrangeville, NY (US); John H. Zhang, Albany, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 15/986,583

(22) Filed: May 22, 2018

(51) Int. Cl.
| | |
|---|---|
| *H01L 27/01* | (2006.01) |
| *H01L 29/78* | (2006.01) |
| *H01L 21/762* | (2006.01) |
| *H01L 29/66* | (2006.01) |
| *H01L 27/088* | (2006.01) |
| *H01L 27/092* | (2006.01) |

(52) U.S. Cl.
CPC .... *H01L 29/7846* (2013.01); *H01L 21/76205* (2013.01); *H01L 27/0886* (2013.01); *H01L 27/0924* (2013.01); *H01L 29/66795* (2013.01); *H01L 29/785* (2013.01); *H01L 29/7842* (2013.01)

(58) Field of Classification Search
CPC ............... H01L 29/7846; H01L 29/785; H01L 21/76205; H01L 29/66795; H01L 29/7842; H01L 27/0924; H01L 21/76224; H01L 21/823821; H01L 27/0886
See application file for complete search history.

(56) References Cited

U.S. PATENT DOCUMENTS

| | | | |
|---|---|---|---|
| 7,138,302 B2 | 11/2006 | Xiang et al. | |
| 8,716,695 B2 | 5/2014 | Cohen et al. | |
| 8,729,634 B2 | 5/2014 | Shen et al. | |
| 9,190,417 B2 | 11/2015 | Chang et al. | |
| 9,196,479 B1* | 11/2015 | Cheng | H01L 21/823807 |
| 9,196,522 B2* | 11/2015 | Ching | H01L 21/76205 |
| 9,368,410 B2 | 6/2016 | Anderson et al. | |
| 9,379,242 B1* | 6/2016 | Lin | H01L 29/7847 |
| 9,530,876 B2 | 12/2016 | Chang et al. | |
| 9,853,056 B1 | 12/2017 | Cheng et al. | |
| 2015/0357470 A1* | 12/2015 | Cheng | H01L 29/0653 257/401 |

* cited by examiner

*Primary Examiner* — Shouxiang Hu
(74) *Attorney, Agent, or Firm* — Garg Law Firm, PLLC; Rakesh Garg; Grant Johnson

(57) ABSTRACT

A semiconductor device is formed to include a fin structure, a first trench at a first lateral end of the fin, a second trench at a second lateral end of the fin, and a filler filled on a first traverse side of the fin and a second traverse side of the fin. The filler is contained between the first trench and the second trench, and oxidized in-place to cause a stress to be exerted on the first and second traverse sides of the fin, the stress causing the fin to exhibit a tensile strain in a lateral running direction of the fin.

7 Claims, 23 Drawing Sheets

STRAINED FIN CHANNEL DEVICES

TECHNICAL FIELD

The present invention relates generally to a method, system, and computer program product for fabricating semiconductor devices which include charge carrying channels in the form of one or more fin structures. More particularly, the present invention relates to a method, system, and computer program product for strained fin channel devices.

BACKGROUND

A Field Effect Transistor (FET) is a semiconductor device that controls the electrical conductivity between a source of electric current (source) and a destination of the electrical current (drain). The FET uses a semiconductor structure called a "gate" to create an electric field, which controls the shape and consequently the electrical conductivity of a channel between the source and the drain. The channel is a charge carrier pathway constructed using a semiconductor material.

Many semiconductor devices are planar, i.e., where the semiconductor structures are fabricated on one plane. A non-planar device is a three-dimensional (3D) device where some of the structures are formed above or below a given plane of fabrication.

A fin-Field Effect Transistor (finFET) is a non-planar device in which a source and a drain are connected using a fin-shaped conducting channel (fin). A finFET can be a horizontal channel device or a vertical channel device A horizontal channel device is a device in which the lateral running direction of the channel is substantially parallel to the plane of fabrication, e.g., the plane of the substrate material. A vertical channel device is a device in which the lateral running direction of the channel is substantially orthogonal to the plane of fabrication.

Generally, a finFET is fabricated as a multi-gate device in which two or more gates are coupled using one or more fin structures by connecting a drain of one gate to the source of another gate using a fin. For example, a fin of a finFET is usually fabricated between two gates such that the source of one gate is on one end of the fin and the drain of the other gate is on an opposite end of the fin. The direction along the lateral length of the fin running from one gate to the other gate is referred to herein as a lateral running direction of the fin.

The illustrative embodiments are described using a finFET as a non-limiting example of a fin channel device contemplated within the scope of the illustrative embodiments. An embodiment can be adapted to strain a fin in a manner described herein in other devices where fin structures are used. Such adaptations are contemplated within the scope of the illustrative embodiments.

For the purposes of the illustrative embodiments, the orientation of the device is described in a three-dimensional space using X, Y, and Z coordinate system. The plane of fabrication is assumed to be the X-Z plane, with vertical structures above the fabrication plane extending in +Y direction and the vertical structures below the fabrication plane extending in −Y direction. This example orientation is not intended to be limiting. From this disclosure, those of ordinary skill in the art will be able to conceive other orientations of semiconductor devices in which an embodiment described herein can be adapted, and such alternate orientations and adaptations are contemplated within the scope of the illustrative embodiments.

SUMMARY

The illustrative embodiments provide a method, system, and computer program product. An embodiment includes a fabrication method that forms a fin structure in a substrate. The embodiment forms a first trench in the substrate at a first lateral end of the fin. The embodiment forms a second trench in the substrate at a second lateral end of the fin. The embodiment fills a filler on a first traverse side of the fin and a second traverse side of the fin between the first trench and the second trench. The embodiment oxidizes the filler in-place, the oxidizing causing a stress to be exerted on the first and second traverse sides of the fin, the stress causing the fin to exhibit a tensile strain in a lateral running direction of the fin.

An embodiment includes a semiconductor fabrication system. The embodiment includes a processor, a computer-readable memory, and a computer-readable storage device, and program instructions stored on the storage device for execution by the processors via the memories, the stored program instructions causing the fabrication system to perform operations of the fabrication method.

An embodiment includes a semiconductor device. The semiconductor device includes structures formed according to the fabrication method.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
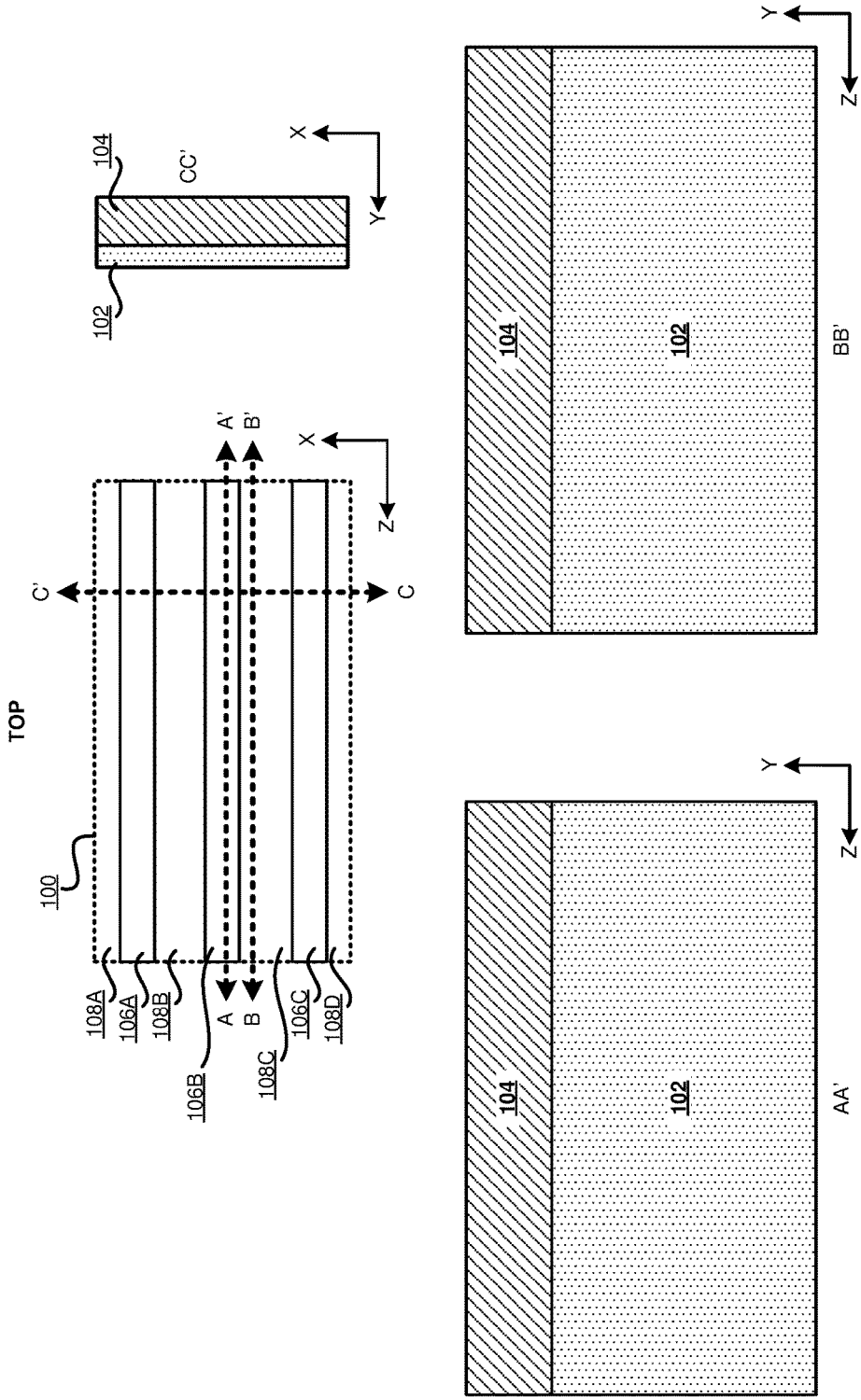
FIG. 1 depicts an example fabrication operation for fabricating an example n-type finFET with a strained fin in accordance with an illustrative embodiment.

Strain is a physical alteration resulting from applying a type of mechanical force. The type of mechanical force that causes strain is called stress. The stress can be tensile or compressive.

Tensile stress causes a stretching or pulling type of strain on the material to which the tensile stress is applied. Tensile stress causes the material under strain to undergo an elongation, stretching or ductile deformation.

Compressive stress causes a compacting or pushing type of strain on the material to which the compressive stress is applied. Compressive stress causes the material under strain to undergo a squeezing or compaction type of deformation.

The illustrative embodiments recognize that strain plays an important role in the behavior of fin channel devices. Specifically, the illustrative embodiments recognize that a fin experiencing strain (strained fin) exhibits better charge mobility as compared to an unstrained fin under otherwise identical circumstances.

Presently, strained fins are created simply by forming embedded source/drain (S/D) structures of a gate on opposite sides of a fin. The illustrative embodiments recognize that such a method of straining a fin is ineffective or only effective to an insignificant degree in finFET devices and other devices that use nanowires or nanosheets.

The illustrative embodiments recognize that a very small amount of strain—of the order of 1 percent—is needed to observe the improved performance in the fin. This small strain must be sustained during the fabrication of other structures of the device. The presently used method of embedded S/D structures causes the strain to dissipate and become substantially inconsequential to the performance of the fin when trenches are formed for S/D structures during device fabrication.

Therefore, the illustrative embodiments recognize that a need exists to strain a fin in a manner different from the embedded S/D technique so that strained fin operates effectively in finFET and other fin channel devices that use nanowire or nanosheet fins. A need exists to strain the fin structure in the lateral running direction of the fin such that when the stressor material is recessed for S/D fabrication, the small strain exerted by the stressor on the fin does not diminish or dissipate. A stressor material is a material that applies stress to a fin, which causes a strain in the fin structure.

The illustrative embodiments used to describe the invention generally address and solve the above-described needs and other problems related to fabricating strained fin channel devices. The illustrative embodiments provide a fabrication method for strained fin channel devices.

An embodiment comprises a semiconductor device described herein. Another embodiment comprises a fabrication process for the contemplated semiconductor device and can be implemented as a software application. The software application implementing an embodiment can be configured as a modification of an existing semiconductor fabrication system—such as a photolithography system, as a separate application that operates in conjunction with an existing semiconductor fabrication system, a standalone application, or some combination thereof. For example, the application causes the semiconductor fabrication system to perform the steps described herein, to fabricate strained fin channel devices, as described herein.

For the clarity of the description, and without implying any limitation thereto, the illustrative embodiments are described using a specific type of fin channel device, namely a finFET. Within the scope of the illustrative embodiments, an embodiment can be implemented with a variety of fin-equipped devices, where straining a fin alters the performance of the fin as recognized with the finFET.

Furthermore, simplified diagrams of the example structures, elements, and device(s) are used in the figures and the illustrative embodiments. In an actual fabrication of a proposed device, additional structures that are not shown or described herein, or structures different from those shown and described herein, may be present without departing the scope of the illustrative embodiments. Similarly, within the scope of the illustrative embodiments, a shown or described structure in the example device may be fabricated differently to yield a similar operation or result as described herein.

Differently shaded portions in the two-dimensional drawing of the example structures, layers, and formations are intended to represent different structures, layers, and formations in the example fabrication, as described herein. The different structures, layers, and formations may be fabricated using suitable materials that are known to those of ordinary skill in the art as belonging to the same class of materials described herein.

A specific shape, location, position, or dimension of a shape depicted herein is not intended to be limiting on the illustrative embodiments unless such a characteristic is expressly described as a feature of an embodiment. The shape, location, position, dimension, or some combination thereof, are chosen only for the clarity of the drawings and the description and may have been exaggerated, minimized, or otherwise changed from actual shape, location, position, or dimension that might be used in actual photolithography to achieve an objective according to the illustrative embodiments.

Furthermore, the illustrative embodiments are described with respect to a specific actual or hypothetical semiconductor device only as an example. The steps described by the various illustrative embodiments can be adapted for fabricating a variety of planar and non-planar devices in a similar manner, and such adaptations are contemplated within the scope of the illustrative embodiments. The specific placements of stressor materials are also used only as non-limiting examples to describe certain options possible with the illustrative embodiments. Those of ordinary skill in the art will be able to use an embodiment to similarly provide sustained small strain to other fin structures in a similar manner, and such usage is also contemplated within the scope of the illustrative embodiments.

An embodiment when implemented in an application causes a fabrication process to perform certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

A device of an embodiment described herein, comprises substantial advancement of the semiconductor device fabrication technology. A manner of straining a fin structure as described herein is unavailable in the presently available methods. Thus, a substantial advancement of such devices or data processing systems by executing a method of an embodiment is in an improved fabrication process for maintaining a strain of the fin structure throughout the fabrication process and avoids using the S/D structures as marginal stressors.

The illustrative embodiments are described with respect to certain types of devices, electrical properties, structures, formations, layers, orientations, directions, steps, operations, planes, materials, dimensions, numerosity, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

The illustrative embodiments are described using specific code, designs, architectures, protocols, layouts, schematics, and tools only as examples and are not limiting to the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures.

The examples in this disclosure are used only for the clarity of the description and are not limiting to the illustrative embodiments. Additional structures, operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

A channel can be n-type or p-type depending on the type of channel material used. Electrons are the charge carriers in an n-type channel material. Holes are the charge carriers in a p-type channel material. FIGS. 1-12 depict various operations performed by a semiconductor fabrication system implementing an illustrative embodiment for fabricating an n-type fin channel device.

With reference to FIG. 1, this figure depicts an example fabrication operation for fabricating an example n-type finFET with a strained fin in accordance with an illustrative embodiment. The fabrication system (system) uses wafer 100 to fabricate the strained fin nfet (n-type finFET).

FIG. 1 depicts four views of wafer 100. The 'TOP' view is the view of the wafer along X and Z axes, which is assumed to be the plane of fabrication in these figures. View AA' is the view along Y and Z axes at section line AA' depicted in the TOP view. View BB' is the view along Y and Z axes at section line BB' depicted in the TOP view. View CC' is the view along X and Y axes at section line CC' depicted in the TOP view. All similarly labeled views are oriented in a similar manner in subsequent figures unless expressly distinguished where used.

Wafer 100 includes substrate 102 of a suitable n-type channel material, e.g., Silicon (Si). The system deposits hard mask 104 on substrate 102. Hard mask 104 is a protective sacrificial layer, which can be formed using silicon nitride (SiN) or any other suitable sacrificial hard mask material, or any suitable combination of multiple hardmask materials. Substrate 102 can be any suitable substrate material, such as, for example, monocrystalline Silicon (Si), Silicon-Germanium (SiGe), Silicon-Carbon (SiC), compound semiconductors obtained by combining group III elements from the periodic table (e.g., Al, Ga, In) with group V elements from the periodic table (e.g., N, P, As, Sb) (III-V compound semiconductor), compounds obtained by combining a metal from either group 2 or 12 of the periodic table and a nonmetal from group 16 (the chalcogens, formerly called group VI) (II-VI compound semiconductor), or semiconductor-on-insulator (SOI). In some embodiments of the invention, substrate 102 includes a buried oxide layer (not depicted). Fins are semiconductors that can have the same material or different materials from the substrate.

Each of regions 106A, 106B, and 106C of wafer 100 will form a fin. Each or regions 108A, 108B, 108C, and 108D will be the region between fins or a non-fin region where other structures will be formed as described herein. The numerosity of depicted fins and non-fin regions is chosen arbitrarily in these figures and is not limiting on the illustrative embodiments.

Figure 2:
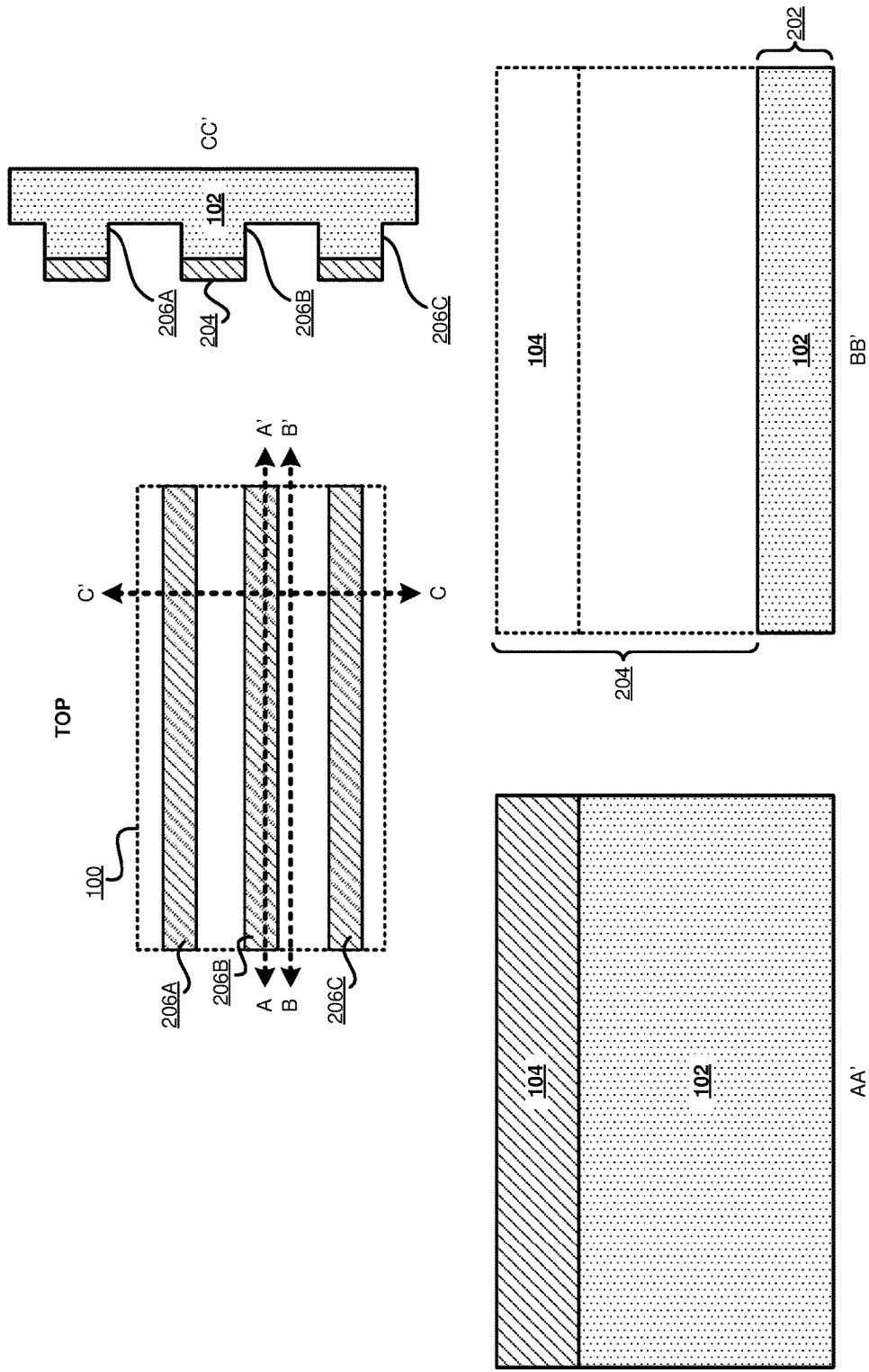
FIG. 2 depicts another example fabrication operation during the fabrication of the example n-type finFET with a strained fin in accordance with an illustrative embodiment.

With reference to FIG. 2, this figure depicts another example fabrication operation during the fabrication of the example n-type finFET with a strained fin in accordance with an illustrative embodiment. The system etches a non-fin region, e.g., any or all of non-fin regions 108A-D to remove material 204 and form modified regions, such as region 202. Specifically, removed material 204 comprises hard mask 104 and some depth of substrate 102 from such a region 202.

In one embodiment, the system uses reactive ion etching (RIE) to remove material 204.

Removal of material 204 to form regions 202 causes the formation of fins 206A, 206B, and 206C as shown. Fins 206A-C retain hard mask 104. In one embodiment, fins 206A-C are formed as, or using, nanosheet or nanowire formations.

Figure 3:
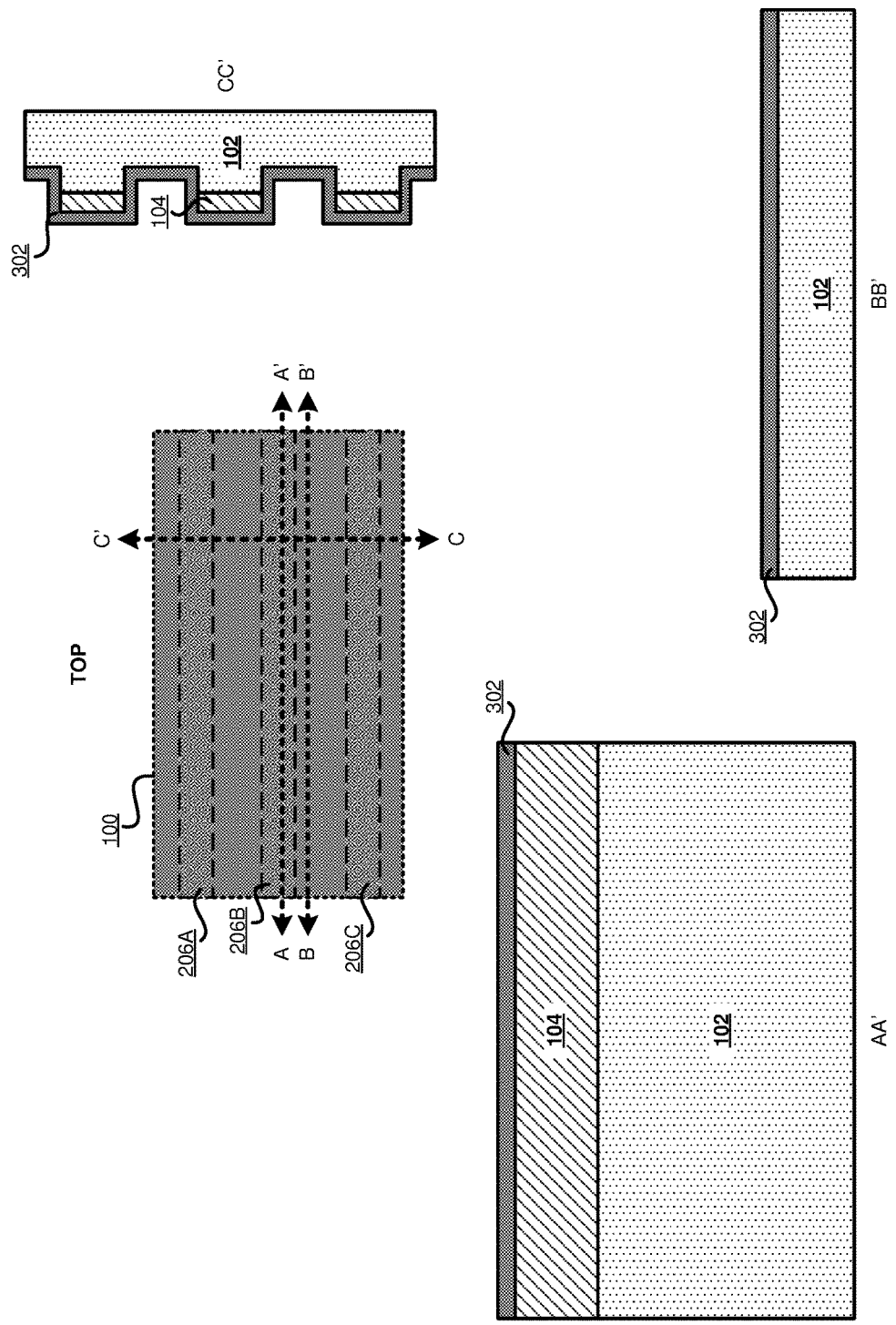
FIG. 3 depicts another example fabrication operation during the fabrication of the example n-type finFET with a strained fin in accordance with an illustrative embodiment.

With reference to FIG. 3, this figure depicts another example fabrication operation during the fabrication of the example n-type finFET with a strained fin in accordance with an illustrative embodiment. The system deposits liner 302 over regions 202 and fins 206A-C. Liner 302 may be formed using any suitable liner material such that liner 302 is capable of protecting fins 206A-C during an oxidation process later. SiN is one non-limiting example of such a liner material. One non-limiting thickness range of SiN that has been found to be suitable for this purpose is from 3 nm to 6 nm.

Figure 4:
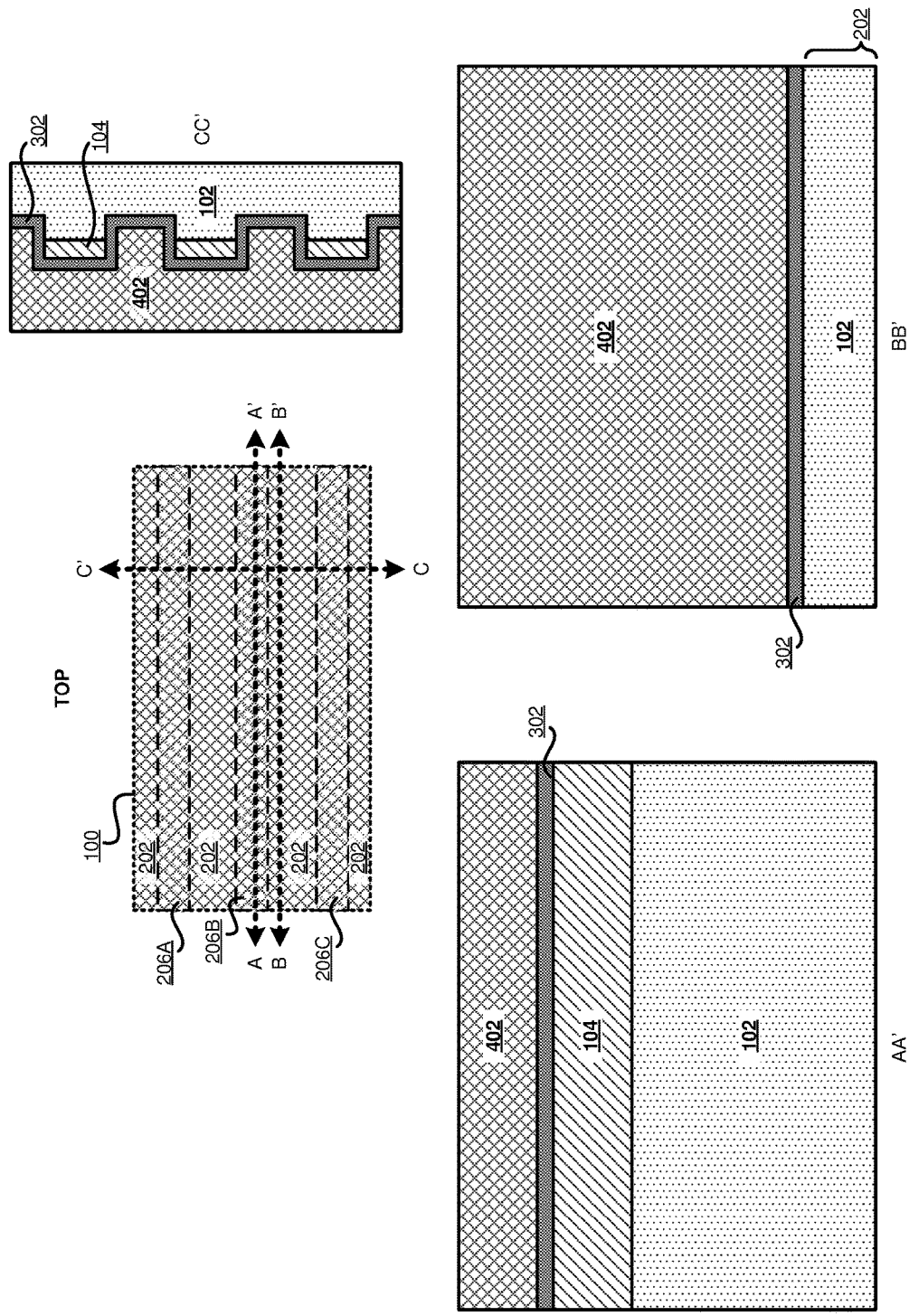
FIG. 4 depicts another example fabrication operation during the fabrication of the example n-type finFET with a strained fin in accordance with an illustrative embodiment.

With reference to FIG. 4, this figure depicts another example fabrication operation during the fabrication of the example n-type finFET with a strained fin in accordance with an illustrative embodiment. The system deposits filler 402 over the entirety of the area designated for the fabrication of the device, i.e., covering regions 202 and fins 206A-C. Material for filler 402 is selected such that the material can be oxidized during a later stage of fabrication. Some non-limiting examples of filler material 402 are polycrystalline Si or Silicon-Germanium (SiGe), or amorphous Si or SiGe.

Figure 5:
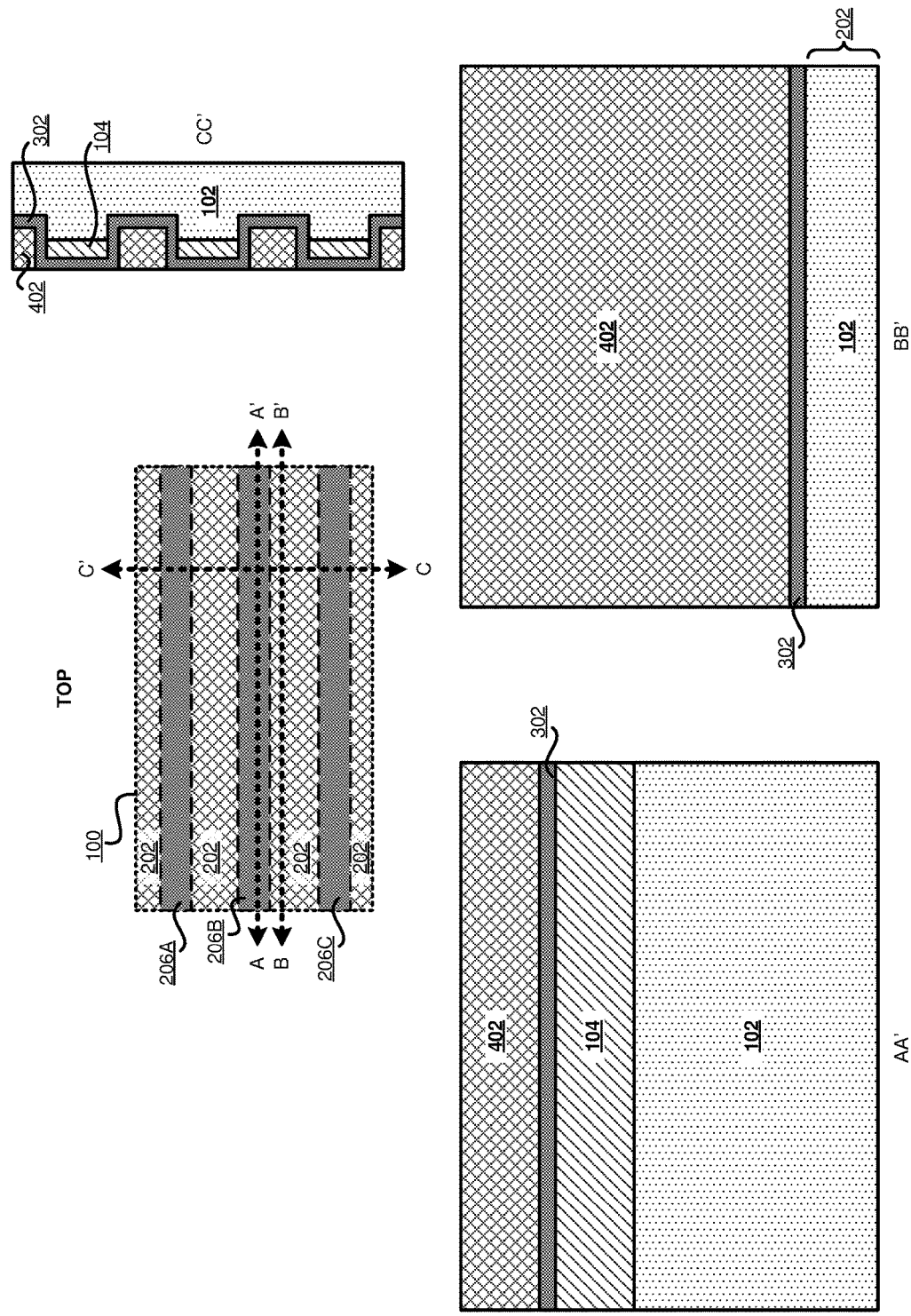
FIG. 5 depicts another example fabrication operation during the fabrication of the example n-type finFET with a strained fin in accordance with an illustrative embodiment.

With reference to FIG. 5, this figure depicts another example fabrication operation during the fabrication of the example n-type finFET with a strained fin in accordance with an illustrative embodiment. The system polishes filler 402 so that the polishing removes filler 402 from fins 206A-C. In other words, the polishing stops at hard mask 302 of fins 206A-C. One example process that is usable for the polishing is chemical-mechanical planarization (CMP).

Figure 6:
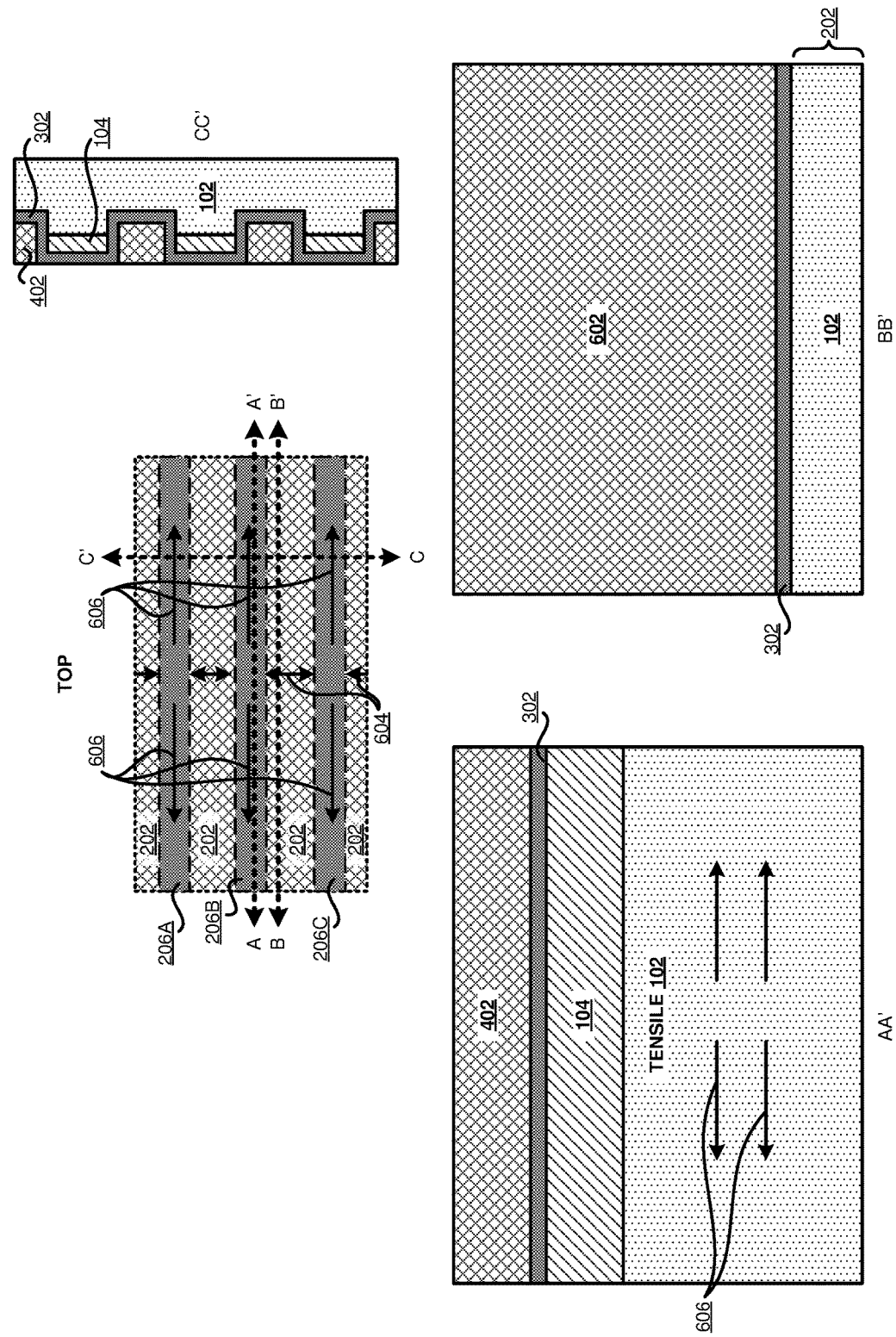
FIG. 6 depicts another example fabrication operation during the fabrication of the example n-type finFET with a strained fin in accordance with an illustrative embodiment.

With reference to FIG. 6, this figure depicts another example fabrication operation during the fabrication of the example n-type finFET with a strained fin in accordance with an illustrative embodiment. The system oxidizes filler 402 to form oxide 602 of the filler material used. The oxidation is an expansive process whereby oxide 602 has a greater physical volume than filler 402. Because the larger volume of oxide 602 has to occupy the same physical space as filler 402, oxide 602 becomes a stressor and exerts stress 604 on fins 206A-C in a direction perpendicular to the lateral running direction of fins 206A-C. Stress 604 causes fins 206A-C to respond to stressing force 604 by exhibiting tensile strain 606 in a direction parallel to the lateral running direction of fins 206A-C. N-type devices with electrons as the conducting carriers exhibit improved fin performance under tensile strain, which is achieved in fins 206A-C in this manner. In some embodiment, a planarization process such as CMP is performed to remove any oxide material that extends above the top surface of the hardmask. Some examples of the oxidation process include furnace oxidation, rapid thermal oxidation, dry oxidation, wet oxidation, and many others.

Figure 7:
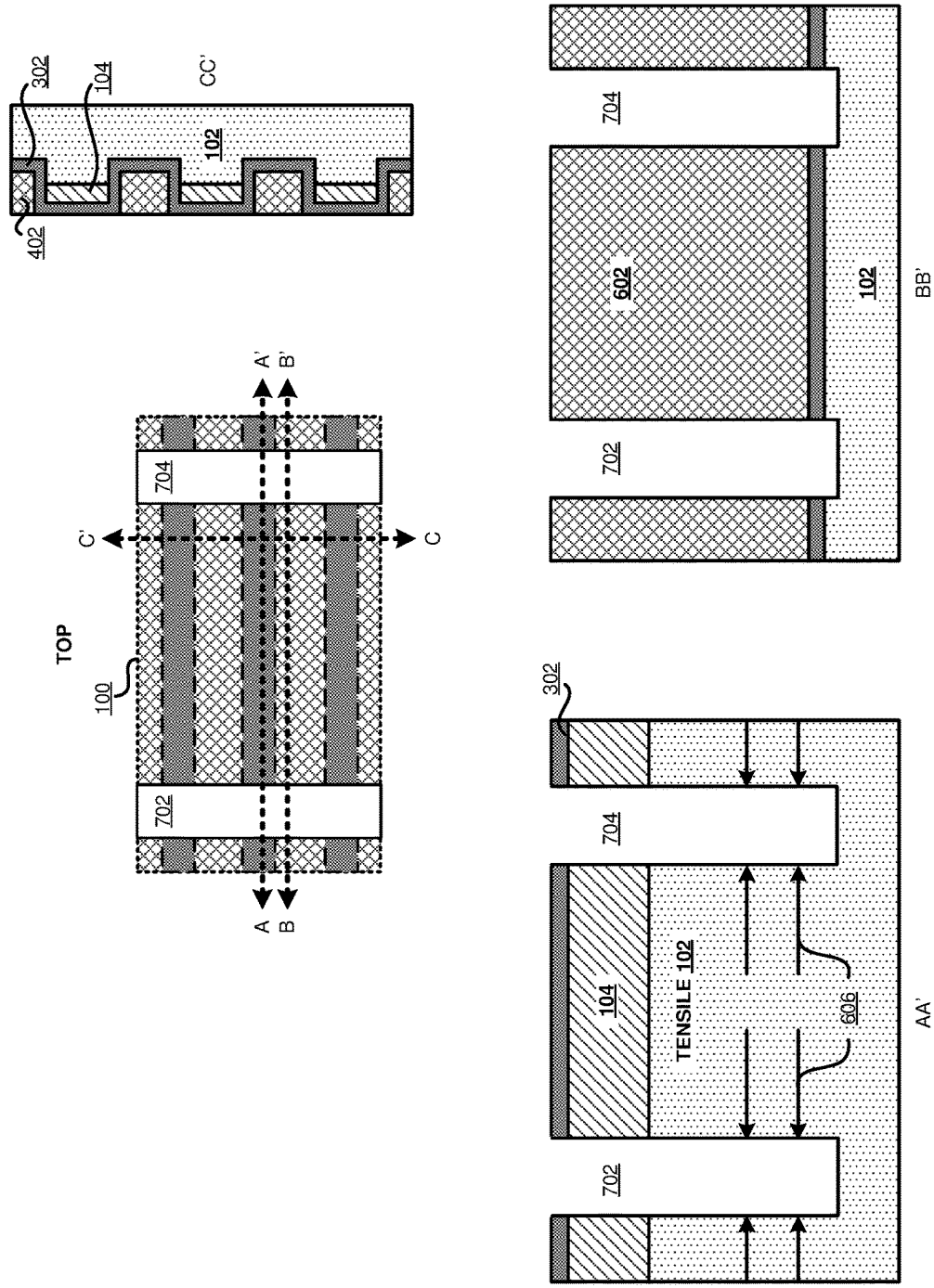
FIG. 7 depicts another example fabrication operation during the fabrication of the example n-type finFET with a strained fin in accordance with an illustrative embodiment.

With reference to FIG. 7, this figure depicts another example fabrication operation during the fabrication of the example n-type finFET with a strained fin in accordance with an illustrative embodiment. The system forms trenches 702 and 704 using a suitable method. Lithography followed by RIE is one example of a method that can be used to form trenches 702 and 704.

Trenches 702 and 704 serve to isolate one instance of finFET from another instance of finFET or another device on wafer 100. Trenches 702 and 704 isolate segments of fins 206A-C and regions 202, and such segments are then usable for forming one instance of strained fin finFET device. Trenches 702 and 704 also allow space in which fins 206A-C can stretch due to tensile strain 606, further enhancing the straining effect on fins 206A-C.

Figure 8:
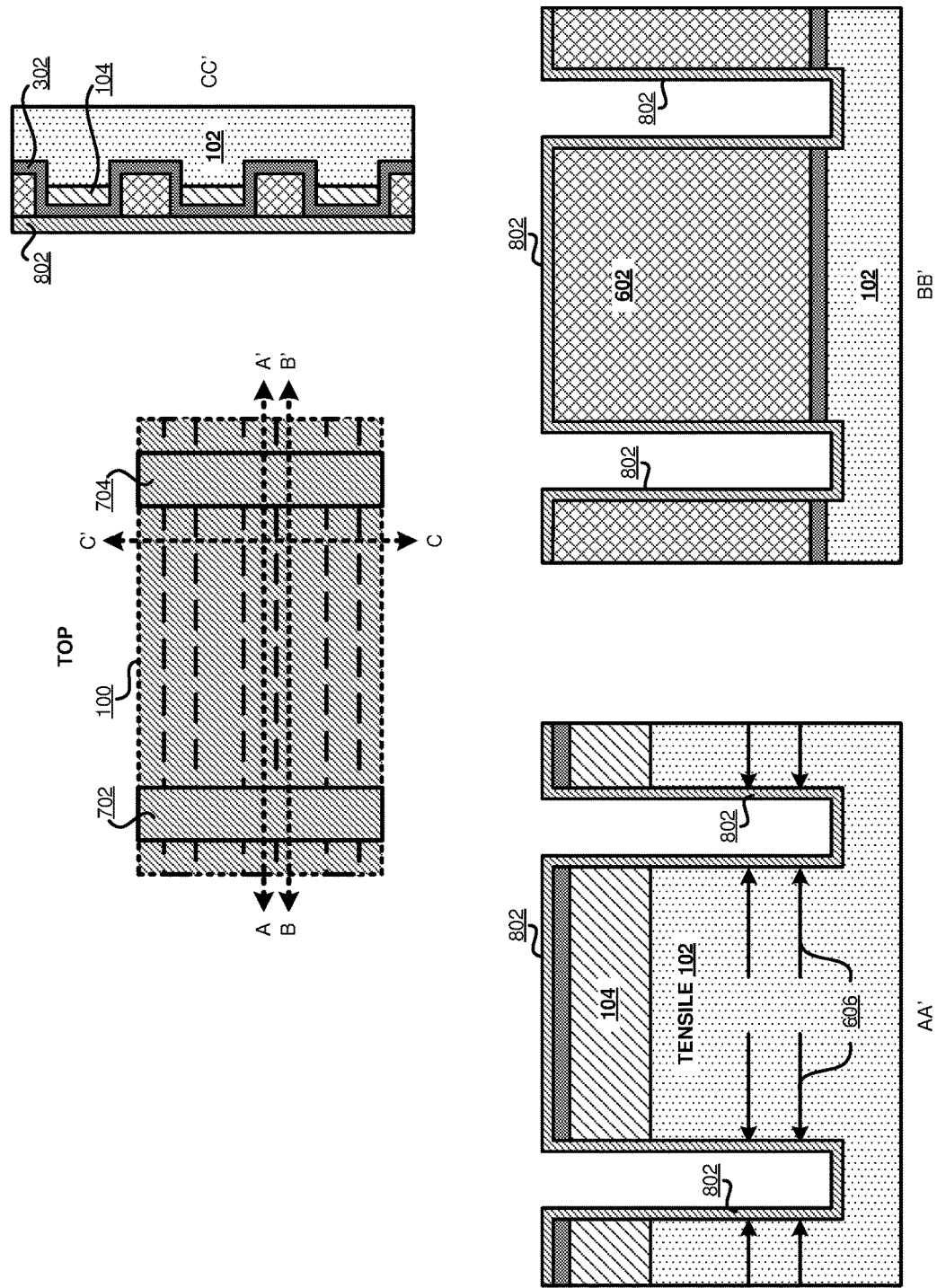
FIG. 8 depicts another example fabrication operation during the fabrication of the example n-type finFET with a strained fin in accordance with an illustrative embodiment.

With reference to FIG. 8, this figure depicts another example fabrication operation during the fabrication of the example n-type finFET with a strained fin in accordance with an illustrative embodiment. The system deposits liner 802 in trenches 702 and 704. Liner 802 can be of any suitable liner material, including but not limited to oxide. Generally, liner 802 can be deposited over wafer 100 to cover the segments of fins 206A-C and regions 202 as well as trenches 702 and 704 as shown within the scope of the illustrative embodiments. In some embodiments, liner 802 can be omitted. In other words, the liner 802 is optional.

Figure 9:
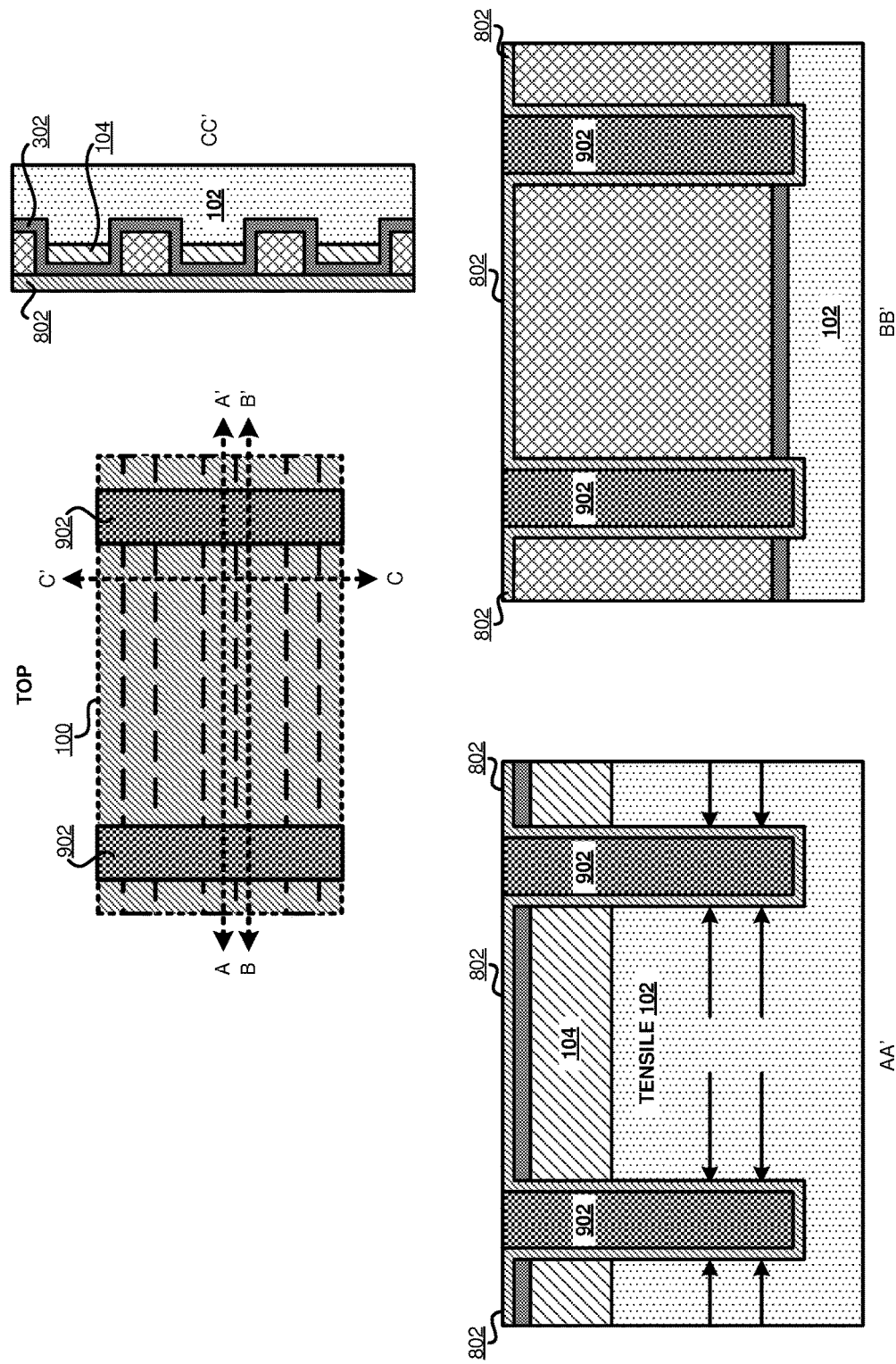
FIG. 9 depicts another example fabrication operation during the fabrication of the example n-type finFET with a strained fin in accordance with an illustrative embodiment.

With reference to FIG. 9, this figure depicts another example fabrication operation during the fabrication of the example n-type finFET with a strained fin in accordance with an illustrative embodiment. The system fills trenches 702 and 704, which are lined with liner 802, with filler material 902. Filler material 902 is a mechanically rigid material, such as SiN, which is more resistant to physical deformation due to stress than the material of fins 206A-C or oxide in regions 202. Thus, the rigid material of filler 902 maintains the strain in fins 206A-C without allowing the strain to dissipate during subsequent formation of other structures, such as gates or S/D.

Additionally, the system polishes filler 902 to a fill level. The fill level of filler 902 is up to and in-line with the surface of liner 802. CMP is one non-limiting example method that is usable for the polishing of filler 902.

Figure 10:
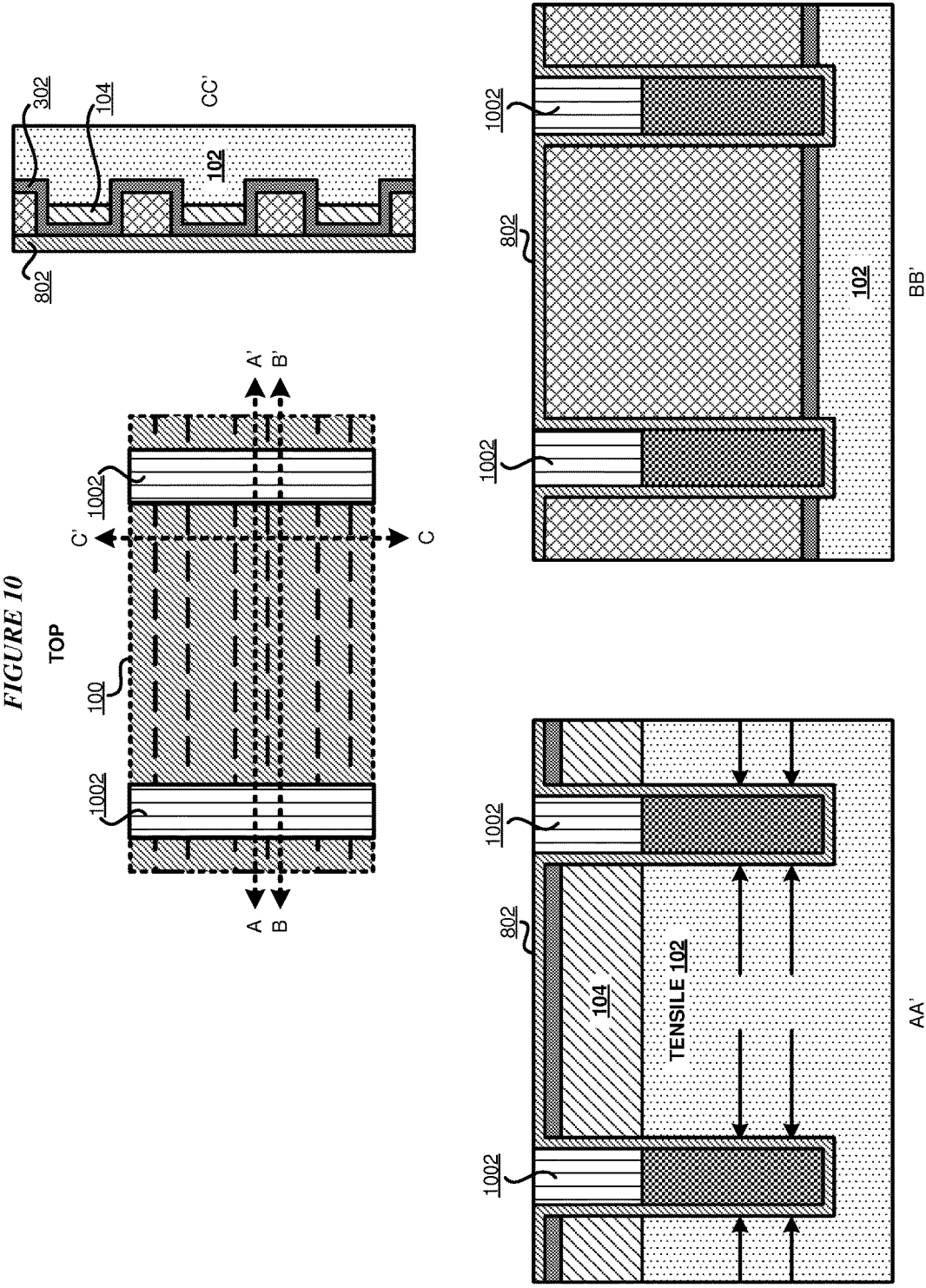
FIG. 10 depicts an optional fabrication operation during the fabrication of the example n-type finFET with a strained fin in accordance with an illustrative embodiment.

With reference to FIG. 10, this figure depicts an optional fabrication operation during the fabrication of the example n-type finFET with a strained fin in accordance with an illustrative embodiment. Optionally, in some implementations, the system recesses filler 902 to a predetermined depth, i.e., to achieve a target thickness of filler 902 in trenches 702 and 704. The system then fills the recess with a suitable dielectric—dielectric 1002. Dielectric 1002 is selective to the rigid filler 902 and liner 802. Silicon oxycarbide (SiOC) is one such dielectric material. The system also polishes dielectric 1002 to become level with the exposed surface of liner 802.

Figure 11:
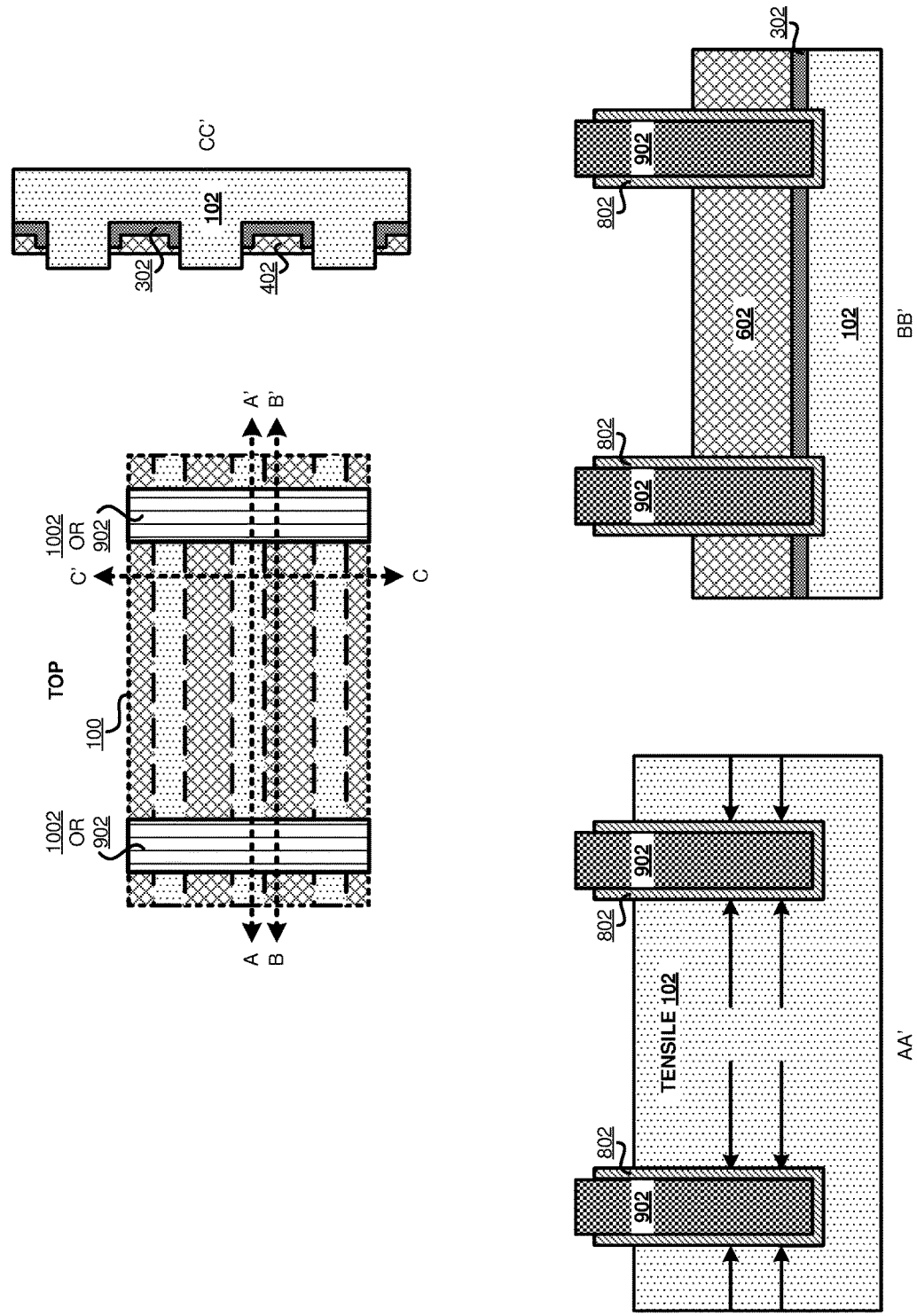
FIG. 11 depicts another example fabrication operation during the fabrication of the example n-type finFET with a strained fin in accordance with an illustrative embodiment.

With reference to FIG. 11, this figure depicts another example fabrication operation during the fabrication of the example n-type finFET with a strained fin in accordance with an illustrative embodiment. The system recesses the oxide in regions 202 and also removes liner 802 around fins 206A-C during the recessing process to reveal fins 206A-C. Fins 206A-C remain strained by rigid filler 902.

Figure 12:
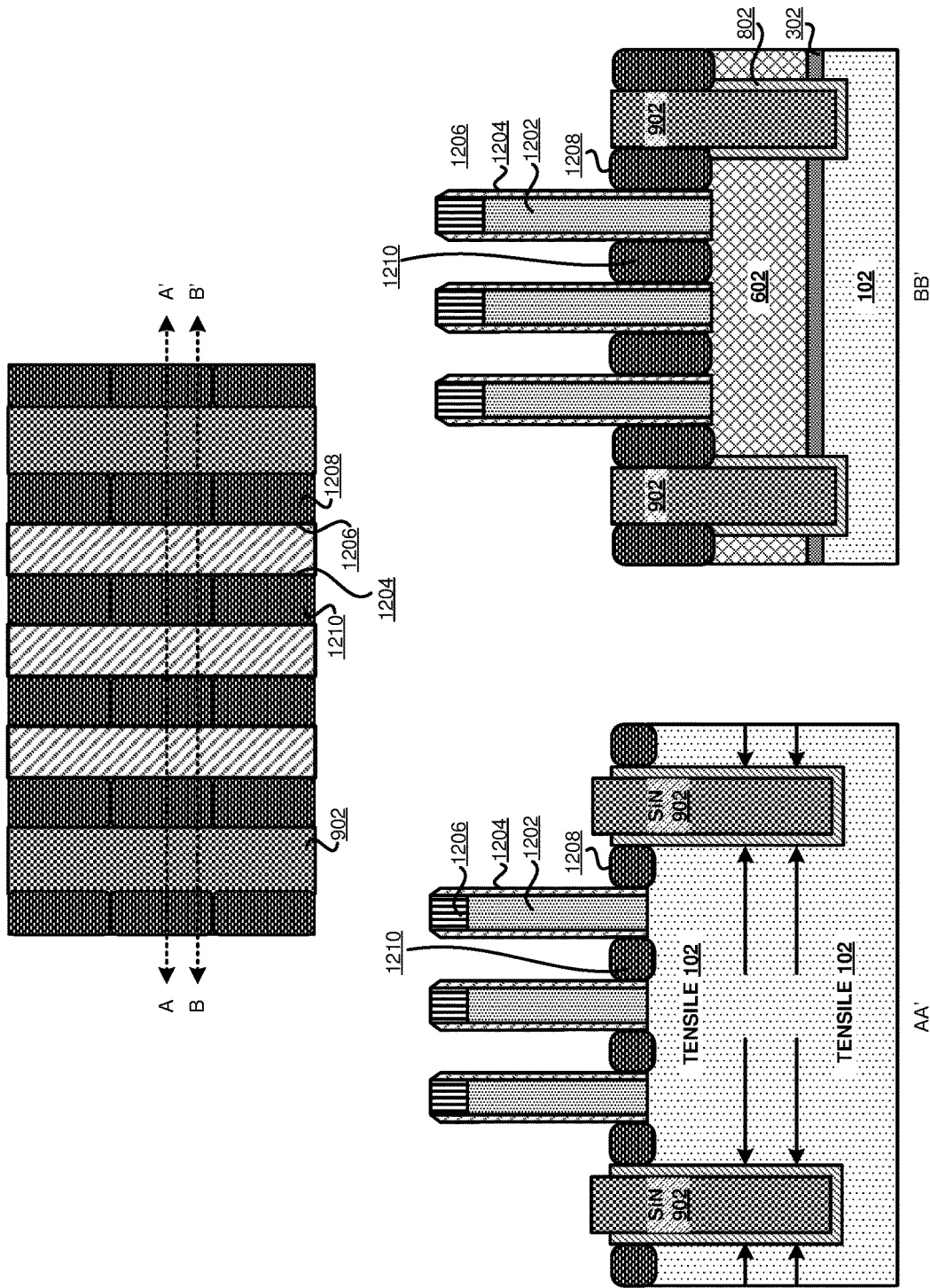
FIG. 12 depicts another example fabrication operation during the fabrication of the example n-type finFET with a strained fin in accordance with an illustrative embodiment.

With reference to FIG. 12, this figure depicts another example fabrication operation during the fabrication of the example n-type finFET with a strained fin in accordance with an illustrative embodiment. The system fabricates one or more gate 1202 having spacers 1204 and gate cap or hard mask 1206. S/D structures 1208 and 1210 are also formed corresponding to gate 1202. Thus, the illustrative embodiments cause a fabrication system to fabricate an example tensile strained fin finFET of the n-type. Gate 1202 can be formed by any suitable method such as gate-first method or replacement metal gate method.

FIGS. 13-23 depict various operations performed by a semiconductor fabrication system implementing an illustrative embodiment for fabricating an p-type fin channel device.

Figure 13:
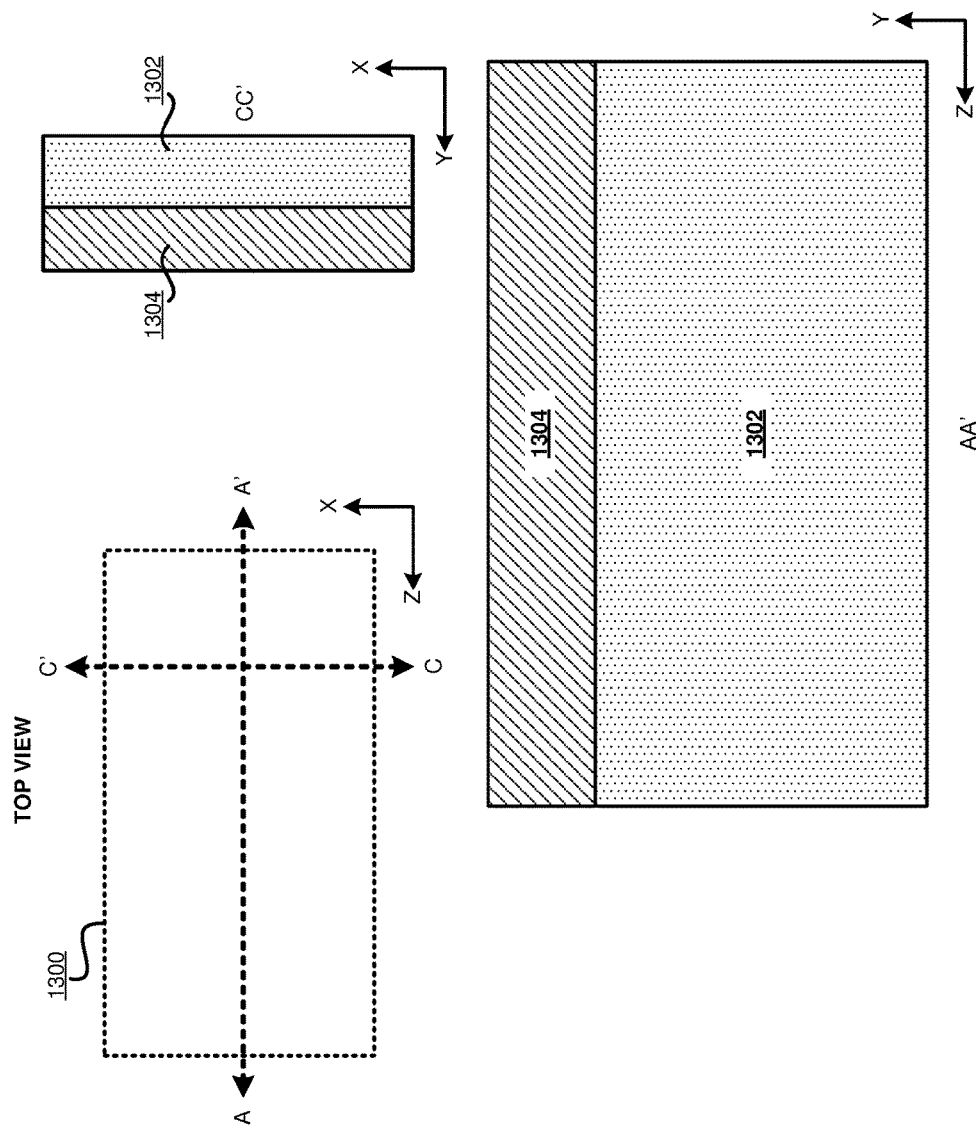
FIG. 13 depicts an example fabrication operation for fabricating an example p-type finFET with a strained fin in accordance with an illustrative embodiment.

With reference to FIG. 13, this figure depicts an example fabrication operation for fabricating an example p-type finFET with a strained fin in accordance with an illustrative embodiment. The fabrication system (system) uses wafer 1300 to fabricate the strained fin pfet (p-type finFET).

FIG. 13 depicts three views of wafer 1300. The 'TOP' view is the view of the wafer along X and Z axes, which is assumed to be the plane of fabrication in these figures. View AA' is the view along Y and Z axes at section line AA' depicted in the TOP view. View CC' is the view along X and Y axes at section line CC' depicted in the TOP view. All similarly labeled views are oriented in a similar manner in subsequent figures unless expressly distinguished where used.

Wafer 1300 includes substrate 1302 of a suitable p-type channel material, e.g., Silicon (Si) wafer. In some embodiments, the p-type channel material comprises silicon germanium (SiGe). The system deposits hard mask 1304 on substrate 1302. Hard mask 1304 is a protective sacrificial layer, which can be formed using SiN or another suitable sacrificial hard mask material.

Figure 14:
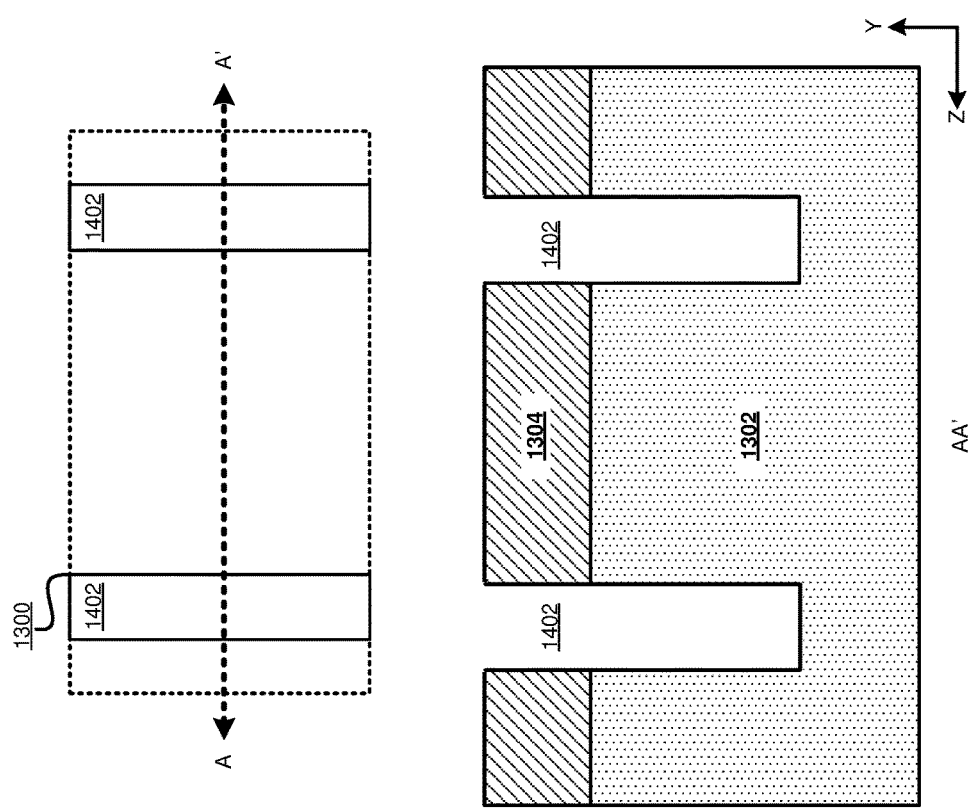
FIG. 14 depicts another example fabrication operation during the fabrication of the example p-type finFET with a strained fin in accordance with an illustrative embodiment.

With reference to FIG. 14, this figure depicts another example fabrication operation during the fabrication of the example p-type finFET with a strained fin in accordance with an illustrative embodiment. The system recesses wafer 1300 to form trenches 1402—one on each end of a segment of wafer 1300 that is to be used for the fabrication of a p-type device. In one embodiment, the system uses lithography followed by RIE to form trenches 1402.

Figure 15:
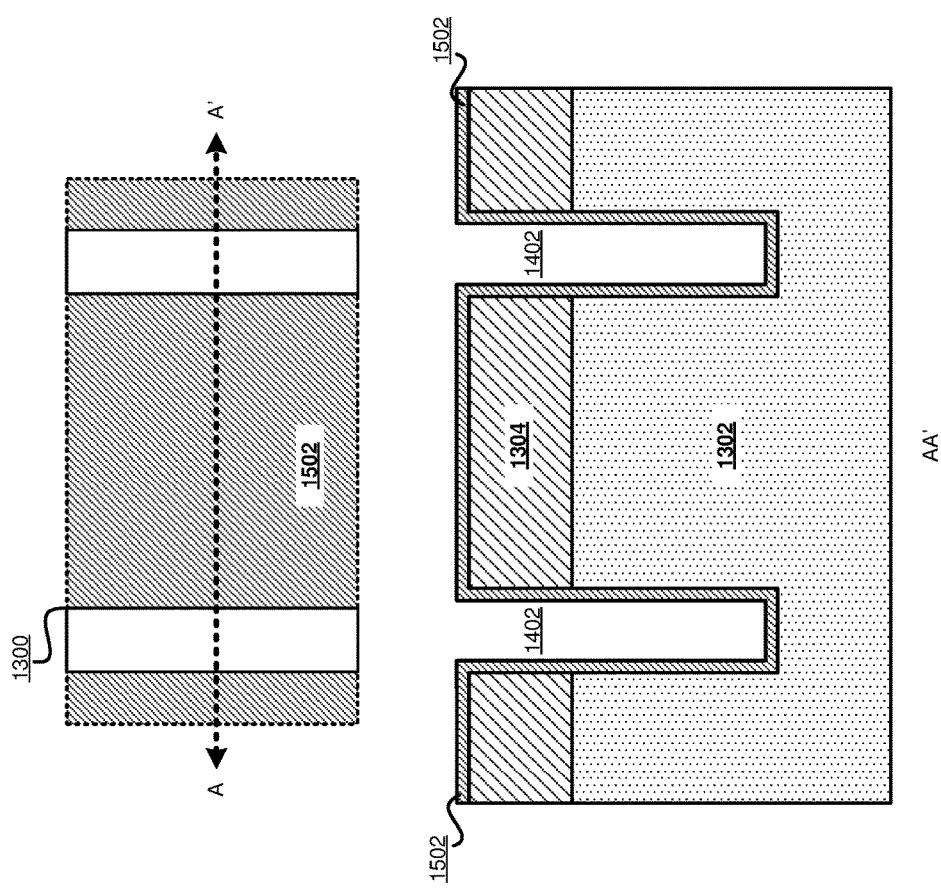
FIG. 15 depicts another example fabrication operation during the fabrication of the example p-type finFET with a strained fin in accordance with an illustrative embodiment.

With reference to FIG. 15, this figure depicts another example fabrication operation during the fabrication of the example p-type finFET with a strained fin in accordance with an illustrative embodiment. The system deposits liner 1502 over substantially all of the device fabrication area of wafer 1300—including in trenches 1402. Liner 1502 may be formed using any suitable liner material such that liner 1502 is capable of protecting the underlying substrate material during an oxidation process later. SiN is one non-limiting example of such a liner material. As described herein, one non-limiting thickness range of SiN is 3-6 nm.

Figure 16:
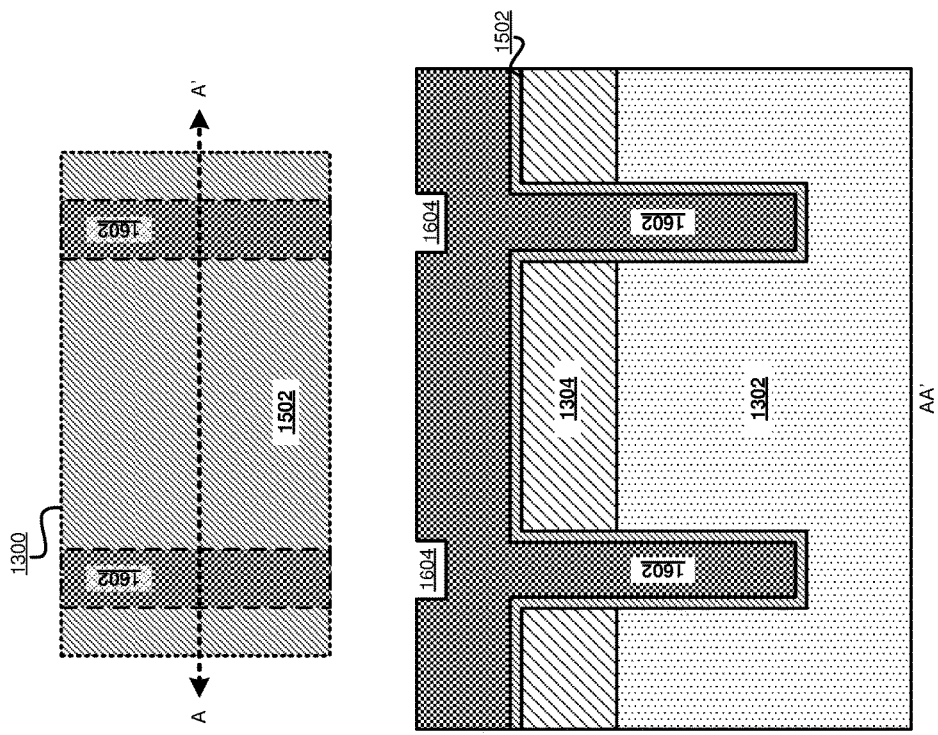
FIG. 16 depicts another example fabrication operation during the fabrication of the example p-type finFET with a strained fin in accordance with an illustrative embodiment.

With reference to FIG. 16, this figure depicts another example fabrication operation during the fabrication of the example p-type finFET with a strained fin in accordance with an illustrative embodiment. The system deposits filler 1602 over the entirety of the area designated for the fabrication of the device, including filling trenches 1402. Material for filler 1602 is selected such that the material can be oxidized during a later stage of fabrication. Some non-limiting examples of filler material 1602 are polycrystalline Si or SiGe, or amorphous Si or SiGe.

The system recesses filler 1602 at the sites of trenches 1402 to form recesses 1604. Recesses 1604 are of a predetermined depth.

Figure 17:
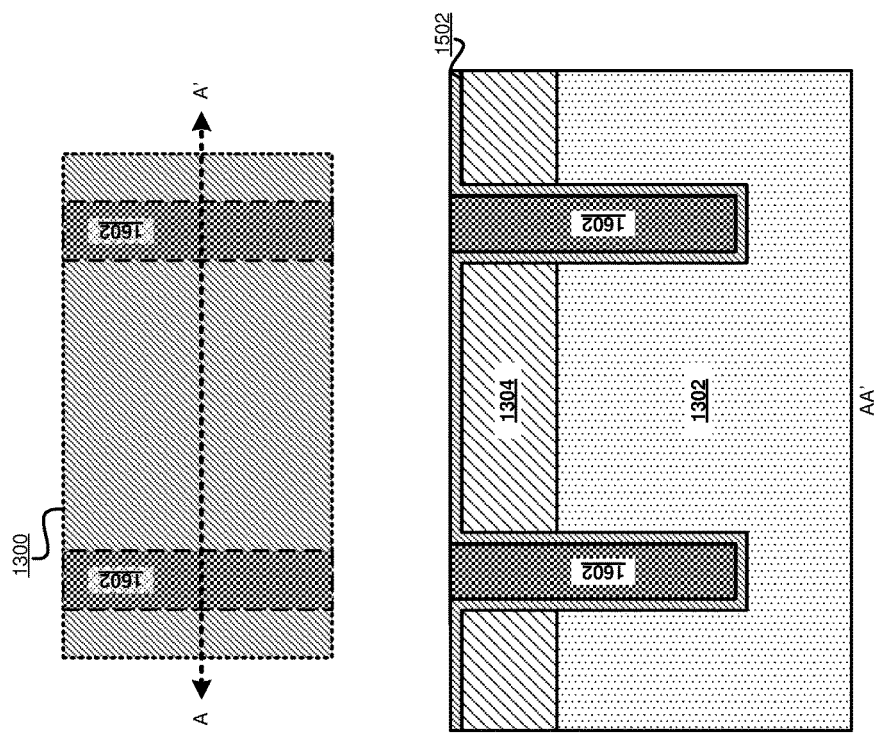
FIG. 17 depicts another example fabrication operation during the fabrication of the example p-type finFET with a strained fin in accordance with an illustrative embodiment.

With reference to FIG. 17, this figure depicts another example fabrication operation during the fabrication of the example p-type finFET with a strained fin in accordance with an illustrative embodiment. The system polishes filler 1602 so that the polishing removes filler 1602 to stop at the top exposed surface of liner 1502, i.e., where liner 1502 covers hard mask 1304 over substrate 1302. One example process that is usable for the polishing is CMP.

Figure 18:
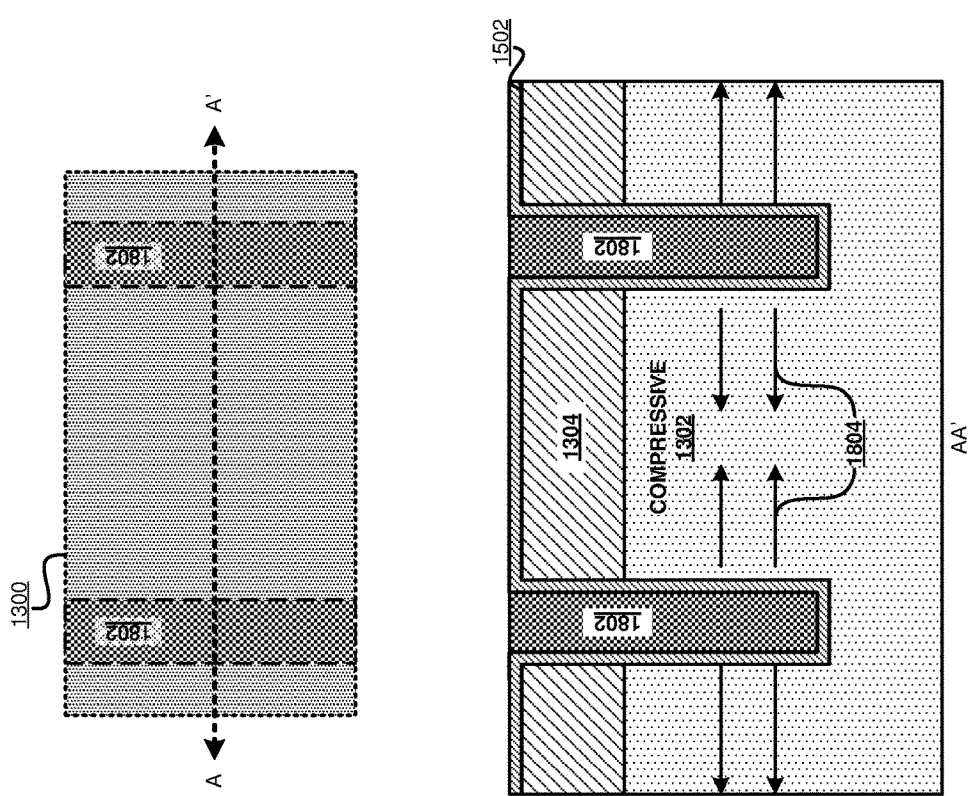
FIG. 18 depicts another example fabrication operation during the fabrication of the example p-type finFET with a strained fin in accordance with an illustrative embodiment.

With reference to FIG. 18, this figure depicts another example fabrication operation during the fabrication of the example p-type finFET with a strained fin in accordance with an illustrative embodiment. The system oxidizes filler 1602 to form oxide 1802 of the filler material used. The oxidation is an expansive process whereby oxide 1802 has a greater physical volume than filler 1602. Because the larger volume of oxide 1802 has to occupy the same physical space as filler 1602, oxide 1802 becomes a stressor and exerts stress 1804 on substrate 1302 in a direction such that stress 1804 causes substrate 1302 to respond to stressing force 1804 by exhibiting compressive strain within substrate 1302. P-type devices with holes as the conducting carriers in the channel exhibit improved fin performance under compressive strain, which is achieved in substrate 1302 in this manner. Strained substrate 1302 is later used to fabricate fins, resulting in compressively strained fins for the p-type device. Some examples of the oxidation process include furnace oxidation, rapid thermal oxidation, dry oxidation, wet oxidation, and many others.

Figure 19:
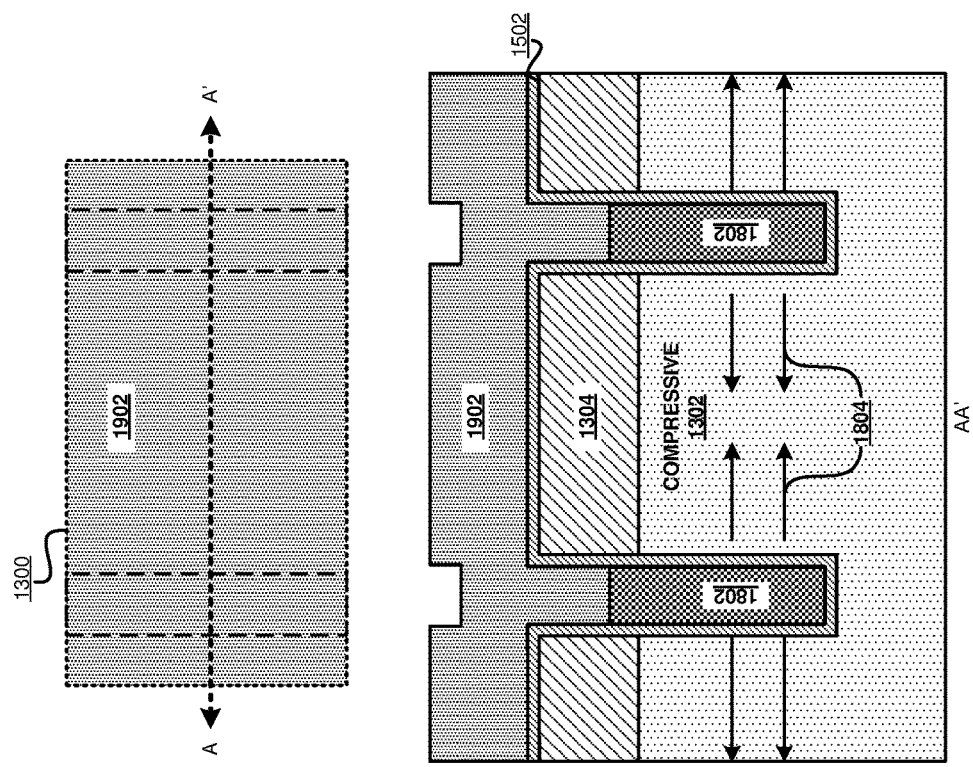
FIG. 19 depicts another example fabrication operation during the fabrication of the example p-type finFET with a strained fin in accordance with an illustrative embodiment.

With reference to FIG. 19, this figure depicts another example fabrication operation during the fabrication of the example p-type finFET with a strained fin in accordance with an illustrative embodiment. The system recesses filler 1802 to a predetermined depth, i.e., to achieve a target thickness of filler 1802. In one embodiment, filler 1802 is recessed to the depth above the top of the semiconductor substrate. The system then fills the recess with a suitable dielectric—dielectric 1902. Dielectric 1902 is selective to the rigid filler 1802 and liner 1502. SiOC is one such dielectric material.

Figure 20:
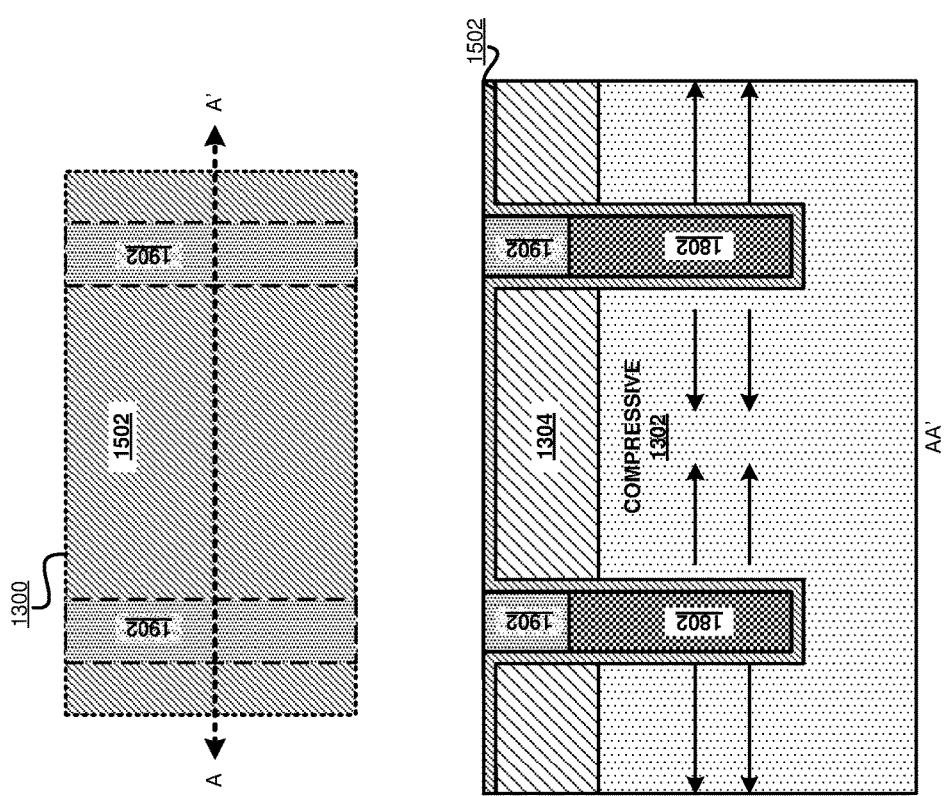
FIG. 20 depicts another example fabrication operation during the fabrication of the example p-type finFET with a strained fin in accordance with an illustrative embodiment.

With reference to FIG. 20, this figure depicts another example fabrication operation during the fabrication of the example p-type finFET with a strained fin in accordance with an illustrative embodiment. The system polishes dielectric 1902 to become level with the exposed surface of liner 1502. The remaining mask 1902 over stressors 1082 in the trenches protects the stressors during subsequent etching and other fabrication operations.

Figure 21:
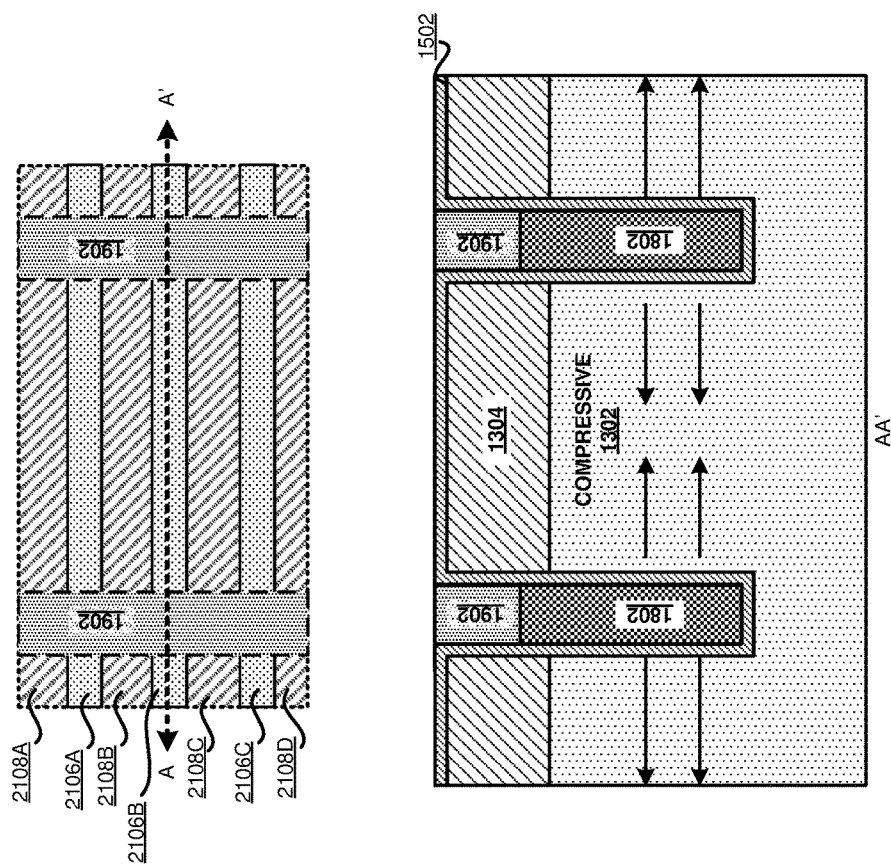
FIG. 21 depicts another example fabrication operation during the fabrication of the example p-type finFET with a strained fin in accordance with an illustrative embodiment.

With reference to FIG. 21, this figure depicts another example fabrication operation during the fabrication of the example p-type finFET with a strained fin in accordance with an illustrative embodiment. The system etches areas 2108A, 2108B, 2108C, and 2108D through liner 1502 and down to a depth in substrate 1302. Such etching creates structures 2106A, 2106B, and 2106C which form the fins of the p-type device. The compressive strain in fins 2106A-C is maintained by stressors 1802 which remain in trenches 1402 during the fin recessing process.

Figure 22:
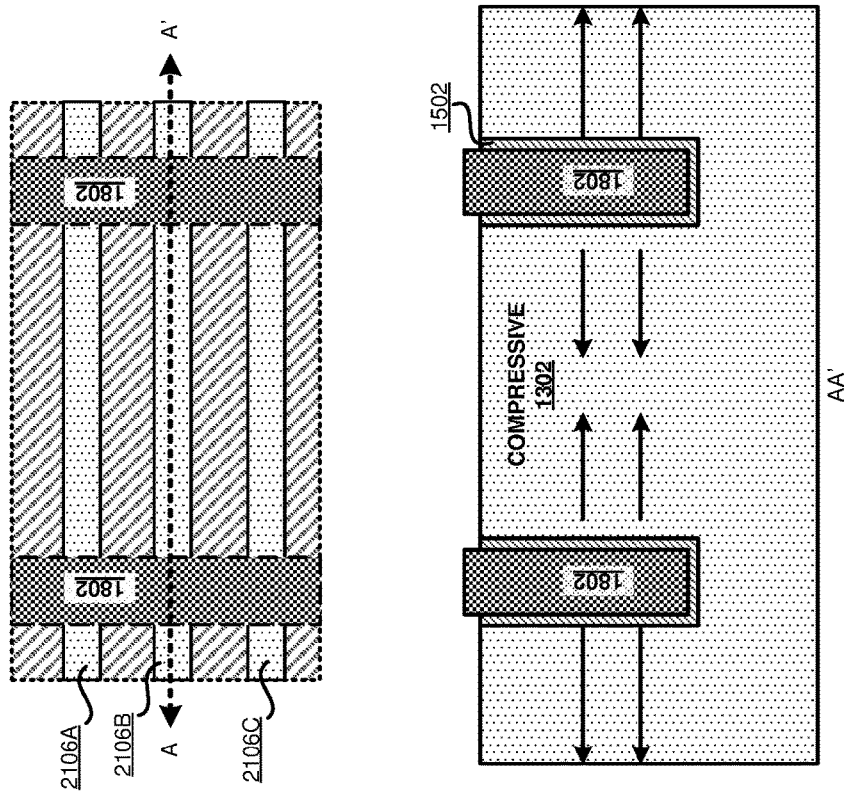
FIG. 22 depicts another example fabrication operation during the fabrication of the example p-type finFET with a strained fin in accordance with an illustrative embodiment.

With reference to FIG. 22, this figure depicts another example fabrication operation during the fabrication of the example p-type finFET with a strained fin in accordance with an illustrative embodiment. The system removes hard mask 1902 from stressors 1802, removes liner 1502 and nitride hard mask 1304 to reveal fins 2106A-C.

Figure 23:
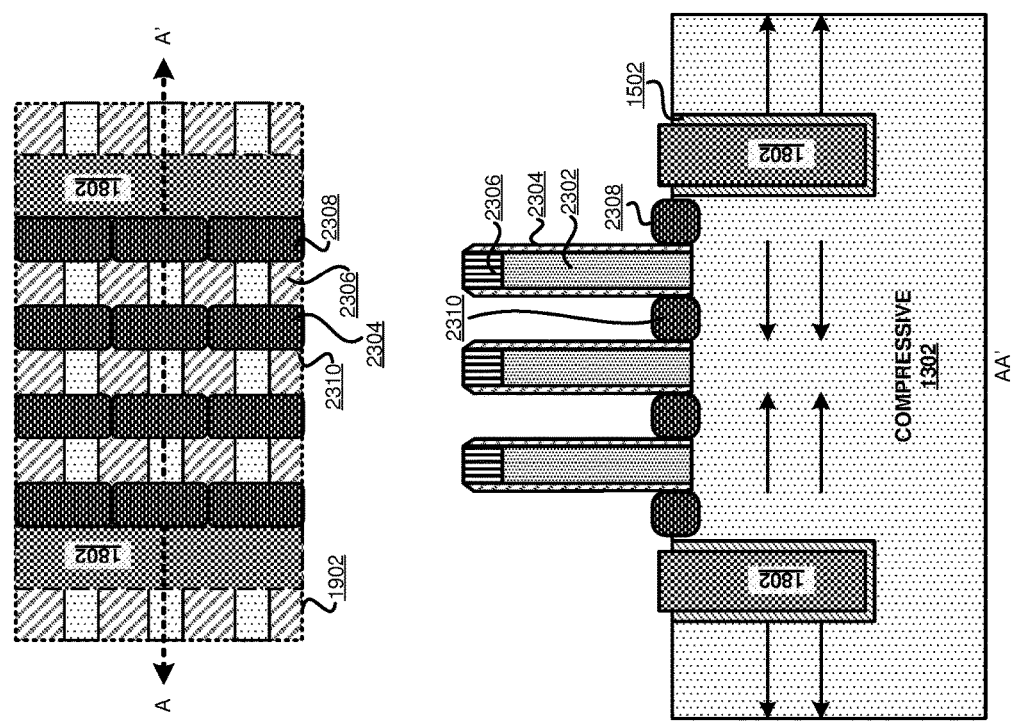
FIG. 23 depicts another example fabrication operation during the fabrication of the example p-type finFET with a strained fin in accordance with an illustrative embodiment.

With reference to FIG. 23, this figure depicts another example fabrication operation during the fabrication of the example p-type finFET with a strained fin in accordance with an illustrative embodiment. The system fabricates one or more gate 2302 having spacers 2304 and gate cap or hard mask 2306. S/D structures 2308 and 2310 are also formed corresponding to gate 2302. Thus, the illustrative embodiments cause a fabrication system to fabricate an example compressively strained fin finFET of the p-type.

While certain steps and processes are described with certain structures, it is to be understood that the steps and/or processes can be adapted to fabricate any of the structure variations described herein within the scope of the illustrative embodiments. While certain materials are used in multiple layers or structures, it is to be understood that substitute materials or different but functionally equivalent materials can be used in place of the described materials at any layers described herein within the scope of the illustrative embodiments. While certain fabrication methods have been used at certain steps, it is to be understood that a fabrication method may be omitted, added, or modified at a described step to achieve functionally similar result from the semiconductor structure within the scope of the illustrative embodiments. While certain operations are described as a "step", several operations can be combined together to form a single fabrication step in a process described herein. While certain orientations have been referred to as "top" and "bottom" with reference to an example vertical orientation of the proposed device, it is to be understood that the device can be reoriented laterally such that the top and bottom become left/right or right/left, or bottom and top, or front/back or back/front, as the reorientation case may be.

Thus, a semiconductor device, fabrication method therefor, and a fabrication system or apparatus therefor using a software implementation of the method, are provided in the illustrative embodiments for strained fin channel devices and other related features, functions, or operations. Where an embodiment or a portion thereof is described with respect to a type of semiconductor device, the fabrication method, system or apparatus, the software implementation, or a portion thereof, are adaptable or configurable for use with a different manifestation of that type of device.

The present invention may be a semiconductor device, system, a method, and/or a computer program product at any possible technical detail level of integration. The computer program product may include a computer readable storage medium (or media) having computer readable program instructions thereon for causing a processor to carry out aspects of the present invention. A computer readable storage medium, including but not limited to computer-readable storage devices as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network.

The substrate contemplated within the scope of the illustrative embodiments can be formed using any suitable substrate material, such as, for example, monocrystalline Si, SiGe, SiC, III-V compound semiconductor, II-VI compound semiconductor, or SOI. In some embodiments of the invention, the substrate includes a buried oxide layer. Fins are semiconductor structures that are formed using the same material or different materials from the substrate.

Fin formation: Fins can be formed by any suitable patterning techniques, including but not limited to, lithography followed by etching. Other suitable techniques, such as sidewall image transfer (SIT), self-aligned double patterning (SADP), self-aligned multiple patterning (SAMP), self-aligned quadruple patterning (SAQP) can be used.

Source and drains are formed on opposite sides of the gates, offset from the gates by the gate spacers. According to an exemplary embodiment, source and drains are formed from an in-situ doped (i.e., during growth) epitaxial material such as in-situ doped epitaxial Si, carbon doped silicon (Si:C) and/or SiGe. Suitable n-type dopants include but are not limited to phosphorous (P), and suitable p-type dopants include but are not limited to boron (B). The use of an in-situ doping process is merely an example. For instance, one may instead employ an ex-situ process to introduce dopants into the source and drains. Other doping techniques include but are not limited to, ion implantation after the bottom source/drain are formed. Dopant techniques include but are not limited to, ion implantation, gas phase doping, plasma doping, plasma immersion ion implantation, cluster doping, infusion doping, liquid phase doping, solid phase doping, in-situ epitaxy growth, or any suitable combination of those techniques.

Spacer material: SiN, SiC, SiOC, SiCN, BN, SiBN, SiBCN, SiOCN, SiON, and combinations thereof. The dielectric material can be a low-k material having a dielectric constant less than about 7, less than about 5. Spacers can be formed by any suitable techniques such as deposition followed by directional etch. Deposition may include but is not limited to, atomic layer deposition (ALD), chemical vapor deposition (CVD). Directional etch may include but is not limited to, reactive ion etch (RIE).

Contacts: The metal contact fill can be tungsten (W), aluminum (Al), or copper (Cu), cobalt (Co), which can further include a barrier layer. The barrier layer can be titanium nitride (TIN), tantalum nitride (TaN), hafnium nitride (HfN), niobium nitride (NbN), tungsten nitride (WN), or combinations thereof, where the barrier layer can prevent diffusion and/or alloying of the metal contact fill material with the top source drain material, and/or anode/cathode material. In various embodiments, the barrier layer can be conformally deposited in the trench(es) by ALD, CVD, MOCVD, PECVD, or combinations thereof. In various embodiments, the metal fill can be formed by ALD, CVD, and/or PVD to form the electrical contacts.

Gate includes gate dielectric and gate conductor. Gate dielectric can comprise any suitable dielectric material, including but not limited to silicon oxide, silicon nitride, silicon oxynitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum, magnesium. The gate dielectric material can be formed by any suitable process or any suitable combination of multiple processes, including but not limited to, thermal oxidation, chemical oxidation, thermal nitridation, plasma oxidation, plasma nitridation, atomic layer deposition (ALD), chemical vapor deposition (CVD), etc. In some embodiments, the gate dielectric has a thickness ranging from 1 nm to 5 nm, although less thickness and greater thickness are also conceived.

Gate conductor can comprise any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO$_2$), cobalt silicide (CoSi), nickel silicide (NiSi)), transition metal aluminides (e.g. Ti3Al, ZrAl), TaC, TaMgC, carbon nanotube, conductive carbon, graphene, or any suitable combination of these materials. The conductive material may further comprise dopants that are incorporated during or after deposition. In some embodiments, the gate may further comprise a workfunction setting layer between the gate dielectric and gate conductor. The workfunction setting layer can be a workfunction metal (WFM). WFM can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and WFM. The gate conductor and WFM can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

What is claimed is:

1. A semiconductor device comprising:
   a fin structure;
   a first trench at a first lateral end of the fin;
   a second trench at a second lateral end of the fin; and
   a filler filled on a first traverse side of the fin and a second traverse side of the fin, wherein the filler is contained between the first trench and the second trench,
   wherein oxidizing the filler in-place causes a stress to be exerted on the first and second traverse sides of the fin, the stress causing the fin to exhibit a tensile strain in a lateral running direction of the fin.

2. The semiconductor device of claim 1, further comprising:
   a rigid filler filled in the first trench and the second trench, the rigid filer preventing the tensile strain in the fin from dissipating during a formation of a source structure and a drain structure.

3. The semiconductor device of claim 1, further comprising:
   a gate formed over the fin;
   a source structure formed coupled to the first traverse side of the fin;
   a drain structure formed coupled to the second traverse side of the fin.

4. The semiconductor device of claim 1, further comprising:
   a first volume of the filler filled on the first traverse side of the fin, wherein the first volume of the filler is contained adjacent to the first traverse side of the fin between the first trench and the second trench; and
   a second volume of the filler filled on the second traverse side of the fin, wherein the second volume of the filler is contained adjacent to the second traverse side of the fin between the first trench and the second trench.

5. A semiconductor device comprising:
   a first trench in a substrate, the first trench having a length direction;
   a second trench in the substrate in the length direction and parallel to the first trench;
   a filler filled in the first trench and the second trench,
   wherein oxidizing the filler in-place causes a stress to be exerted on an intermediate segment of the substrate between the first trench and the second trench, the stress causing the intermediate segment to exhibit a compressive strain in a direction of the length; and
   a fin formed by etching the intermediate segment in a direction perpendicular to the length, wherein the fin maintains the compressive strain.

6. The semiconductor device of claim 5, further comprising:
   a liner in the first trench and the second trench, wherein the liner prevents the substrate from oxidation during the oxidizing of the filler.

7. The semiconductor device of claim 5, further comprising:
   a gate formed over the fin;
   a source structure formed coupled to a first traverse side of the fin; and
   a drain structure formed coupled to a second traverse side of the fin.

* * * * *